United States Patent [19]

Leach et al.

[11] Patent Number: 5,374,889
[45] Date of Patent: Dec. 20, 1994

[54] MAGNETIC RESONANCE MEASUREMENT

[75] Inventors: Martin O. Leach, Wallington; Jonathan C. Sharp, Leicester, both of United Kingdom

[73] Assignee: National Research Development Corporation, London, England

[21] Appl. No.: 217,128

[22] PCT Filed: Aug. 18, 1989

[86] PCT No.: PCT/GB89/00966
§ 371 Date: Apr. 22, 1991
§ 102(e) Date: Apr. 22, 1991

[87] PCT Pub. No.: WO90/02344
PCT Pub. Date: Mar. 8, 1990

Related U.S. Application Data

[63] Continuation of Ser. No. 106,777, Aug. 16, 1993, abandoned, which is a continuation of Ser. No. 651,227, Apr. 22, 1991, abandoned.

[30] Foreign Application Priority Data

Aug. 19, 1988 [GB] United Kingdom ............... 8819705

[51] Int. Cl.$^5$ ............................................. G01R 33/20
[52] U.S. Cl. ........................................ 324/309; 324/307
[58] Field of Search ............... 324/300, 307, 309, 310, 324/311, 312, 313, 314

[56] References Cited

U.S. PATENT DOCUMENTS

| | | | |
|---|---|---|---|
| 4,318,043 | 3/1982 | Crooks et al. | 324/309 |
| 4,649,347 | 3/1987 | Hwang | 324/309 |
| 4,684,893 | 8/1987 | Kojima et al. | 324/309 |
| 4,710,716 | 12/1987 | Keren et al. | 324/309 |
| 4,736,160 | 4/1988 | Sano et al. | 324/307 |
| 4,743,851 | 5/1988 | Lim et al. | 324/309 |
| 4,830,012 | 5/1989 | Riederer | 324/309 |
| 4,908,573 | 3/1990 | Kaufman et al. | 324/309 |
| 4,933,639 | 6/1990 | Barker | 324/309 |
| 4,970,457 | 11/1990 | Kaufman et al. | 324/309 |
| 4,983,920 | 1/1991 | Lampman et al. | 324/309 |

FOREIGN PATENT DOCUMENTS

| | | | |
|---|---|---|---|
| 0217578 | 4/1987 | European Pat. Off. | G01N 24/08 |
| 0301396 | 7/1988 | European Pat. Off. | |
| 2114756 | 8/1983 | United Kingdom | G01N 24/08 |
| 2121188 | 12/1983 | United Kingdom | G01N 24/08 |
| 88/01381 | 2/1988 | WIPO | |
| 88/03655 | 5/1988 | WIPO | |
| 8804058 | 6/1988 | WIPO | G01N 24/08 |
| 8806288 | 8/1988 | WIPO | G01N 24/08 |

OTHER PUBLICATIONS

Medical Physics, vol. 13, No. 5, Sep./Oct. 1986 Berstein et al: Pulse sequence generated oblique magnetic resonance imaging: Applicators to Cardiac Imaging.
Journal of Magnetic Resonance, vol. 74, No. 3, Oct., 1987, Bottomley et al Progress in efficient 3D Spatially Localized in Vivo $^{31}$p NMR Spectroscopy using Multi-dimensional Spatially Selective (p) pulses.

*Primary Examiner*—Kenneth A. Wieder
*Assistant Examiner*—Raymond Y. Mah
*Attorney, Agent, or Firm*—Harness, Dickey & Pierce

[57] ABSTRACT

In nuclear magnetic resonance spectroscopy spatial localization of the output signal is achieved by using gradient magnetic fields and radio-frequency inversion pulses to define slices through a sample from which a signal is obtained. The use of intersecting slices allows the field of view to be reduced to the region of intersection to study a localized volume of interest in the sample. Conventionally, three orthogonal gradient magnetic fields can be defined by energizing successively three gradient magnetic field coils. With the present invention combinations of the gradient magnetic field coils are energized simultaneously to allow the field of view to be more closely conformed to a described volume of interest. This simultaneous energization allows the field of view to be rotated relative to the axes of the coils and/or allows non-orthogonal intersecting slices to be defined to alter the shape of the field of view at the intersection of the slices. Further, more than three slices may be defined to allow polyhedral fields of view to be defined. The invention is applicable to many modern forms of nuclear magnetic resonance spectroscopy.

16 Claims, 3 Drawing Sheets

MAGNETIC RESONANCE MEASUREMENT

This is a continuation of U.S. patent application Ser. No. 08/106,777, filed Aug. 16, 1993, (now abandoned) which is a continuation of Ser. No. 07/651,227, filed Apr. 22, 1991 (now abandoned).

This invention relates to magnetic resonance spectroscopy and in particular to methods of measurement in which the signals received from the sample are processed to give a spectrum from a localized region of the sample. Such techniques are particularly useful in medical applications of nuclear magnetic resonance (N.M.R.) for examining at a particular organ or region, e.g. tumour, in a body.

As is well known, N.M.R. relies on the resonant oscillation of magnetic nuclei, e.g. protons or phosphorus 31 or fluorine 19, which have been aligned by a magnetic field (usually referred to as $B_o$), the resonant oscillations being induced by applying an oscillatory magnetic field (referred to as $B_1$) which is usually the magnetic component of a radio wave. In modern spectroscopy, rather than measuring the absorption of the applied R.F. wave to make the measurement an R.F. pulse is applied to the sample and this causes the sample to emit a low intensity R.F. signal.

It is possible to localize the spectrum to a particular portion of the sample by adding to the uniform magnetic field $B_o$, a field which varies in strength over the region occupied by the sample. Since the resonant frequency of the nuclei is a function of field strength $B_o$, the resonant frequency will vary through the sample. Thus, taking a simple view, using an excitation pulse of one particular frequency will only resonate the nuclei in a particular part of the sample and the emitted signal will be representative of only that part. If the magnetic field strength is set to have a linear gradient in one direction then the shape of the region excited will be a slice orthogonal to that direction, the slice being the locus of points where the field strength is such that the resonant frequency equals the applied frequency. In practice the technique used is more complex than this. The magnetic nuclei are first oriented throughout the sample using a uniform field. Then the nuclei in a slice of the sample are inverted by applying a gradient field and selective signal, which may be an resonance signal of chosen frequency and shape. Finally a read-out resonance R.F. signal is applied to the whole sample and the weak R.F. signal emitted from the sample is detected. The signal from the inverted nuclei is reversed in phase and subtracts from the signal from the others. If this signal is subtracted from a signal obtained with a uniform field, then the result is representative of the slice of inverted nuclei only. This technique has been used to obtain a signal from a cuboidal region of the sample using sums from three orthogonal slices. The volume which is selected by the intersection of the slices is known as the "volume of interest" or VOI.

The accurate localisation of spectra to well defined regions of interest is of critical importance to the utility of many in-vivo NMR spectroscopic techniques, and consequently many methods have been advanced to solve the technical and practical problems involved. One of the most successful techniques employed for localised NMR spectroscopy is Image-Selected in-vivo spectroscopy or ISIS. This method has many beneficial features that make it suitable for in-vivo spectroscopy in general including: freely positionable volumes of interest (VOIs), relatively modest gradient switching requirements, and multi-volume capability. It is suitable for Phosphorus 31 spectroscopy in particular because of minimal $T_2$ weighting ($T_2$ is a relaxation time), optimum signal-to-noise ratio (SNR) and, due to the use of adiabatic pulses (pulses which are sufficiently slow that the magnetization of the sample follows the applied field), substantial tolerance to inhomogeneity in the applied oscillatory RF magnetic field $B_2$ allowing the use of small, surface coils. Another important feature of ISIS is that it can be incorporated into many other NMR experiments such as the measurement of relaxation times or measurements using other localisation techniques including imaging sequences. The short minimum experiment time, compared to other imaging techniques such as Fourier techniques, facilitates time course studies.

The principles behind the ISIS technique may be demonstrated by an examination of the simplest possible ISIS experiment which consists of two scans, localizing to a slice. In the first scan the signal from the whole sensitive volume of the R.F. coil is acquired using a non-selective read pulse, which may be of the adiabatic half passage type, while in the second, prior to an identical read pulse, a slice selective inversion is performed, employing a hyperbolic secant 180 deg pulse, in conjunction with a linear $B_o$ field gradient. Spins lying outside the slice are unaffected by the selective pulse, so given the condition that prior to each scan the magnetization is in a steady state then, within the stability limits of the system, these spins will contribute equal signal in both scans. Thus, within these limits, subtraction of the second signal, or FID, from the first will eliminate all signal from outside the slice.

Spins within (or on the edge of) the slice contribute signal according to $$S2 = S1\,[1-(1-\cos(A))e^{-TI/T1}]$$

where A is the flip angle due to the selective pulse, TI the interval between the inversion pulse and the read pulse, T1 the longitudinal relaxation time and S1 and S2 the signals from the first and second scans respectively.

Thus if within the slice A=180 deg and if TI/T1 is small then S2=−S1 and subtraction yields the full SNR available from two measurements hence localization to a single slice has been achieved in a 2 scan experiment. The sequence may be extended, see FIG. 2, to achieve localization to a cube by using eight different scans which cycle through all ON/OFF permutations for the three inversion pulses, each pulse corresponding to an orthogonal slice (X, Y or Z). The inversion pulses are chosen so that when the signals from the eight scans are summed, all signals which did not originate from the VOI cancel.

Multiple VOI's may be interrogated simultaneously by addition of further slices, for example 2 cubes require a minimum of 4 slices and 16 scans.

However, as demonstrated in FIG. 1, an important practical difficulty regularly encountered in in-vivo spectroscopy is that a cuboid volume of interest often fits imperfectly into the desired portion of the organ or lesion under investigation, resulting in the choice between either the selection of a smaller-than-ideal VOI, FIG. 1(a), with the concomitant loss of SNR, or the risk of spectral contamination from adjacent tissues encroaching into the VOI, FIG. 1(b). The original solution proposed to this problem by Ordidge and co-workers (Ordidge R. J., Connelly A. & Lohman J. A. B. J.Magn.Reson. 66, 283, 1986) was the acquisition of spectra from multiple cuboids FIG. 1(c), which are subsequently summed to produce an irregularly shaped VOI. However, in common with other methods that seek to achieve localisation to irregular regions by summation of sub-spectra from N sub-regions this method suffers a SNR loss in proportion to root N, which is highly undesirable and in many cases, for example 31P studies of human tumours in vivo, may be unacceptable.

The present invention provides a method of magnetic resonance measurement which enables the volume of interest to be conformed to the boundaries of an irregularly shaped region, FIG. 1(d), in a small number of scans, whilst maintaining optimum signal-to-noise ratio over the volume of interest. As applied to one method of nuclear magnetic resonance this method is being termed 'Conformal ISIS' (C-ISIS).

According to an aspect of the present invention the volume of interest in the sample is defined by non-orthogonal inversion preparation or selection slices which may be achieved by selective energization of combinations of the three gradient magnetic field coils at appropriate amplitudes.

In general a number of scans will be used with appropriate summation of results to localize to the signal from a particular sampled region.

The gradient magnetic fields may be applied in pulses, the gradient being non-time-varying during the pulse. Also, the fields may be spatially non-uniform to define non-planer, e.g. curved, slices.

Thus the present invention provides a method of spatially localized magnetic resonance spectroscopy including the step of energizing selected ones of a plurality of gradient magnetic field coils each of which individually can create a gradient magnetic field in a respective direction in a sample and applying electro-magnetic preparation pulses to the sample during application of the gradient magnetic field to select a slice of the sample from which a resonance signal is to be detected, characterised by the steps of energizing at least two of the gradient magnetic field coils with simultaneous pulses which comprise concurrent periods of respective steady levels to create a gradient magnetic field in a direction different to that of those provided by the coils if energized separately, subsequently applying a further electromagnetic preparation pulse while energizing at least one of the gradient field coils by a different magnitude to select slice which is non-orthogonal to the aforesaid slice, and subsequently detecting the resonance signal from the sample to derive a signal from a localized region of the sample.

The present invention also provides apparatus for spatially localized magnetic resonance spectroscopy including a plurality of gradient magnetic field coils each of which can create a gradient magnetic field in a respective direction to a sample, first means for applying electro-magnetic preparation pulses to the sample to select a slice of the sample from which a resonance is to be detected by a detector, characterised by second means for energizing at least two of the gradient magnetic field coils simultaneously with pulses which comprise concurrent periods of respective steady levels to create a magnetic field in a direction different to that of those provided by the coils if energized separately, and third means applying a further electromagnetic preparation pulse while said second means energize at least one of the coils by a different magnitude to select slice which is non-orthogonal to the aforementioned slice, whereby a signal from a localized region of the sample can be derived from the resonance signal.

Three or more intersecting slices may be defined through the sample to create a polyhedral sampled region, e.g. four slices can define a tetrahedron or octahedron and six slices can define a dodecahedron. and the slices may be oriented and positioned to define unconnected sampled regions in the sample.

The method may include the steps of: energizing a first combination of the gradient magnetic field coils and applying a first electro-magnetic preparation pulse to the sample, successively energizing at least one of the gradient field coils by a different magnitude at least three further times each with application of a respective electro-magnetic preparation pulse, subsequently applying a read-out signal to the sample and reading the resonance signal from the sample, and repeating the above steps with different energizations of the gradient field coils and combining the results to derive a signal from a localized region of the sample.

The method may also include the step of applying a suppression, preparation or editing pulse train to a sample, for instance: two excitation pulses applied immediately after the suppression signal and one excitation pulse immediately before the read signal as in a STEAM sequence.

The invention is also applicable to many other spectroscopic localization techniques which formerly used 3 orthogonal slices to examine a VOI and which use different sequences of field gradient and excitation pulses including VSE (Aue W.P., Muller, S., Cross T.A. and Seelig J. J. Magn. Res. 56, 350, 1984), SPARS (Luyten P. R. and Hollander J. A.Den Magn. Reson. Imaging 4, 237, 1986), VOSY (Kimmich R., Schnur G., Hoepfel D. and Ratzel D. Phys. Med. Biol. 32, 1335, 1987), STEAM (Frahm J., and Merboldt K. D., Hanicke W. and Haase A. J. Magn. Res. 64, 81 1985) and SPALL (Kienlin M.von and Decorps M Works in Progress, 6th Meeting of Society of Magnetic Resonance in Medicine, New York, 53, 1987).

The invention will be further described by way of non-limitative example with reference to the accompanying drawings, in which:

FIGS. 1a–f illustrates the localization of regions to irregularly shaped sites;

Figure 1A:
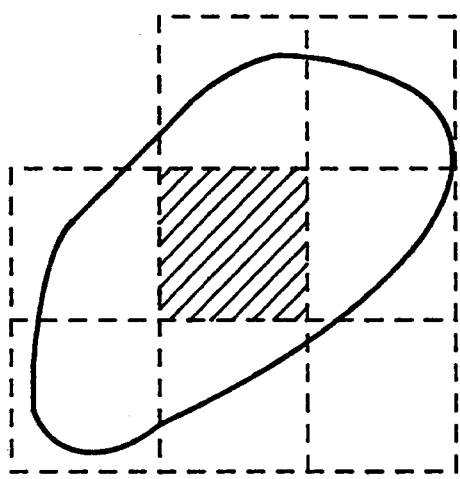
Figure 1B:
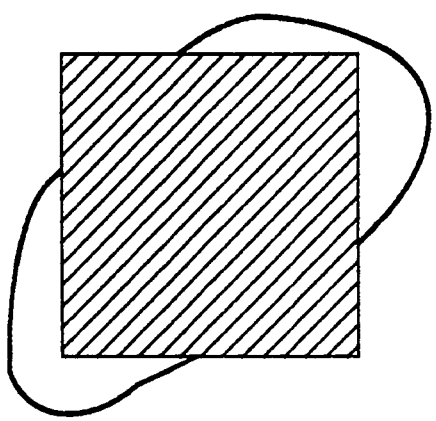
Figure 1C:
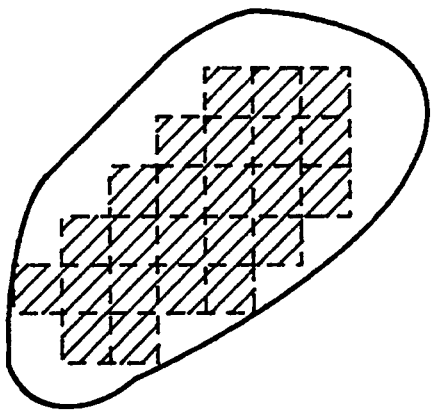
Figure 1D:
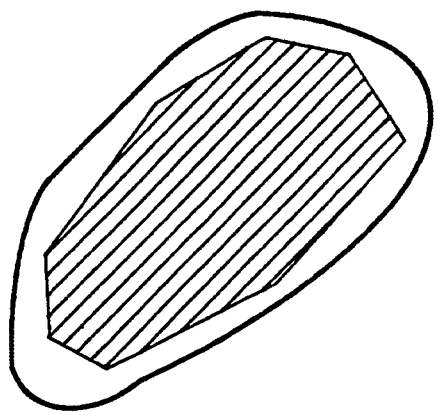
Figure 1E:
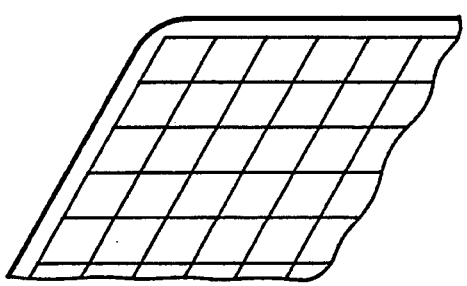
Figure 1F:
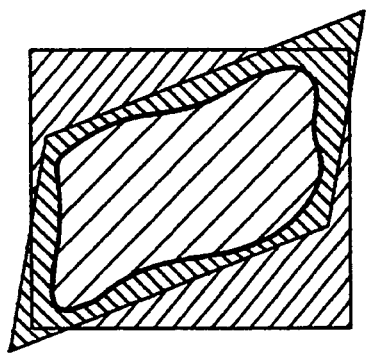
Figure 2:
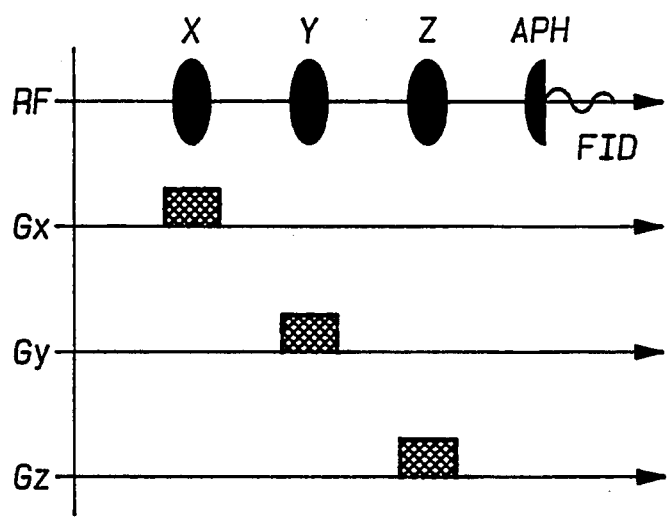
FIG. 2 shows a prior art ISIS pulse sequence.

In order to assist the understanding of the present invention, a standard ISIS sequence is shown in FIG. 2. To obtain a result this sequence is followed by seven others with different inversion pulses and the results summed. At the top, labelled RF, is the radio frequency signal. The first three signals labelled X, Y and Z are selective pulses which comprise high frequency signals modulated by a low frequency envelope. Each of these pulses are applied to the sample simultaneously with a gradient magnetic field pulse in either the X, Y or Z direction as shown on the lower three axes. Each combination of an R.F. pulse and a gradient magnetic field pulse causes a slice inversion in the respective orthogonal direction. Therefore, three orthogonal slices are inverted and a non-selective read pulse, labelled AHP, is applied to the whole sample and the received signal, marked FID is detected. Then, seven more scans are performed, each time using different combinations of slice inversion signals. The eight detected signals are summed so that a signal originating from only the VOI is obtained.

However, as shown in FIG. 1 and discussed above this technique has the problem that cuboidal VOI's do not conform accurately to irregular shaped regions, and in medical applications many regions of interest are irregularly shaped.

The present invention achieves improved localization by tailoring the shape and orientation of the VOI in three dimensions.

According to the invention the shape of the VOI is modified by using non-orthogonal slices in the sample. The volume of interest defined by the intersection of three slices is only a cuboid if all three slices are mutually orthogonal as defined by the three gradient coils. However, the volume defined by three arbitrarily oriented slices is a parallelepiped. Thus by choosing the orientation of the three slices, the shape of the VOI can be varied to conform to a desired shape.

Multi-dimensional $B_O$ gradient spectroscopic localization techniques such as Fourier techniques; Brown T. R. Kircaid B. M. and Ugurbil K; Proc. Nath. Acad. Sci. 79 3523–6 (1982); and Hadamard techniques; Muller S. Magn. Reson. Med. 6, 364 (1988); Bolinger L & Leigh J. S. J. Mag. Res. 80,162 (1988); Ordidge R. J. Bowley R. M. & McHale G. Mag. Res. Med. 8,323 (1988) are conventionally implemented within a Cartesian coordinate system, each spatial dimension corresponding to a single gradient coil: X, Y or Z. The coordinate direction is defined by selection, phase-encoding or read-out gradients having the same ventor direction as the gradients used to prepare the region. However there are two circumstances in which it may be useful to employ oblique axes, resulting in voxels and a field of view (FOV) of parallelepipedal shape.

The first case is the reduction of partial volume effects which occur when a voxel overlaps two distinct anatomical regions. By the alignment of the array axes with anatomical boundaries the voxel shape may be tailored to conform better to the edges of the site under investigation and thus avoid contamination, FIG. (IE).

The second is the improvement in spatial resolution for a given array by reduction of the FOV volume. Signals from sample regions outside the FOV either produce aliasing artifacts (Fourier) or are lost (Hadamard; Fourier + volume suppression). In either case it may often be possible to significantly reduce the FOV volume without penalty by conforming the FOV to the target region, FIG. 1(F). This also applies to magnetic resonance imaging (MRI) sequences as well as spectroscopy and allows increased resolution through the more efficient use of the imaged volume. Both of these methods increase the number of useful voxels that may be acquired in a given experiment.

Thus the invention allow VOI's to be defined with considerably improved flexibility and provide improvements in localization and signal-to-noise ratio for many situations.

This may be advantageously combined with further improvements in conforming the VOI to the desired region by using more than three slices to form more complex volumes than those used to date from which localized C-ISIS spectra may be obtained. So, as three slices can define a parallelepiped of any shape, size, orientation and location, four slices as produced by the sequence of pulses shown in FIG. 3 may define more complex regular or irregular polyhedra including tetrahedra and octahedra.

Figure 3:
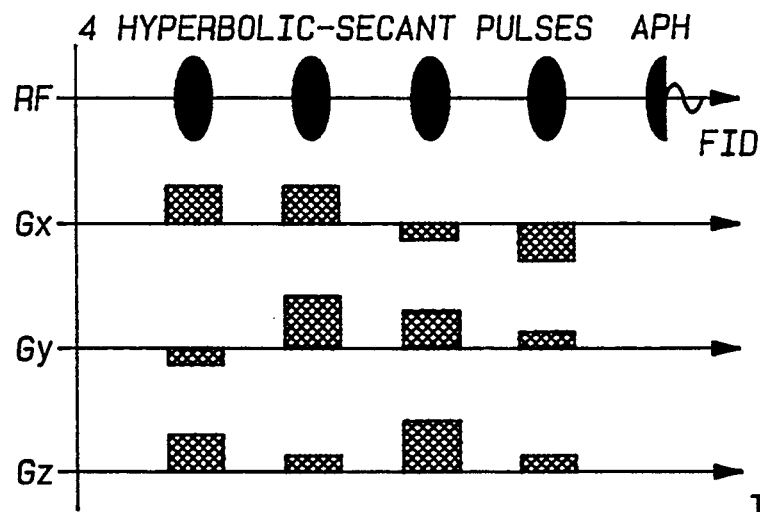
FIG. 3 shows an ISIS pulse sequence according to the present invention.

In the sequence shown in FIG. 3, during each of the four slice inversion pulses from the RF coil, a gradient field is applied to the sample by each of the X, Y and Z gradient field coils. These gradient fields are of such a magnitude and sense that the slices are oriented as desired. After the definition of the four slices, the normal non-selective read pulse is used to excite the nuclei to produce the detected FID signal. Clearly, the resulting detected signal will include not only the signal from the region of intersection but also the signal from the rest of each of the four slices.

Subsequently, fifteen further scans are carried out, each with different combinations of slice inversions. The combinations are chosen so that, at some stage, the signal from the remainder of each slice is reversed. Thus summing all sixteen signals detected after the respective read-out pulses produces a result from only the desired region.

This process is shown simplified in Table 1 below:

TABLE 1

| | THE SIGN OF SIGNAL FROM EACH TYPE OF REGION: | | | | | | | SIGN OF SIGNAL FROM EACH TYPE OF REGION WHEN BUFFED ACCORDING TO POLYHEDRON +/− SCHEME (5th Column): | | | | | | |
|---|---|---|---|---|---|---|---|---|---|---|---|---|---|---|
| | SLICES | | | | PRISM | PARALL-ELEPIPED | POLY-HEDRON | | | | | | | |
| EXPT | A | B | C | D | AuB | AuBuC | AuBuCuD. column | A | B | C | D | AuB | AuBuC | AuBuCuD |
| 1 | 2 | | | | 3 | 4 | 5 | 6 | | | | 7 | 8 | 9 |
| 1 | + | + | + | + | + | + | + | + | + | + | + | + | + | + |
| 2 | + | + | + | − | + | + | − | − | − | − | + | − | − | + |
| 3 | + | + | − | + | + | − | − | − | − | + | − | − | + | + |
| 4 | + | + | − | − | + | − | + | + | + | − | − | + | − | + |
| 5 | + | − | + | + | − | − | − | − | + | − | − | + | + | + |
| 6 | + | − | + | − | − | − | + | + | − | + | − | − | − | + |
| 7 | + | − | − | + | − | + | + | + | − | − | + | − | + | + |
| 8 | + | − | − | − | − | + | − | − | + | + | + | + | − | + |
| 9 | − | + | + | + | − | − | − | + | − | − | − | + | + | + |
| 10 | − | + | + | − | − | − | + | − | + | + | − | − | − | + |
| 11 | − | + | − | + | − | + | + | − | + | − | + | − | + | + |
| 12 | − | + | − | − | − | + | − | + | − | + | + | + | − | + |
| 13 | − | − | + | + | + | + | + | − | − | + | + | + | + | + |

TABLE 1-continued

| | THE SIGN OF SIGNAL FROM EACH TYPE OF REGION: | | | | | | | SIGN OF SIGNAL FROM EACH TYPE OF REGION WHEN BUFFED ACCORDING TO POLYHEDRON +/− SCHEME (5th Column): | | | | | | |
|---|---|---|---|---|---|---|---|---|---|---|---|---|---|---|
| | SLICES | | | | PRISM | PARALL-ELEPIPED | POLY-HEDRON | | | | | | | |
| EXPT | A | B | C | D | AuB | AuBuC | AuBuCuD. column | A | B | C | D | AuB | AuBuC | AuBuCuD |
| 1 | 2 | | | | 3 | 4 | 5 | 6 | | | | 7 | 8 | 9 |
| 14 | − | − | + | − | + | + | − | + | + | − | + | − | − | + |
| 15 | − | − | − | + | + | − | − | + | + | + | − | − | + | + |
| 16 | − | − | − | − | + | − | + | − | − | − | − | + | − | + |
| BOP.: | | | | | | | | 0 | 0 | 0 | 0 | 0 | 0 | 16 |

This shows the add/subtract scheme for a 16 scan experiment to localize signal from a polyhedron defined by the intersection of 4 slices. The table contains columns for only one of the six prisms (AuB,AuC,AuD,-BuC,BuD,CuD), and one of the four parallelepipeds (AuBuC,AuBuD,AuCuD,BuCuD). Since the ordering of the slices is arbitrary it follows that there will be no signal contribution from any of these other regions either. For clarity the effects of incomplete spin inversion and T1 recovery have been neglected in this table. (These effects result in a loss of SNR from the VOI but do not impair the spatial selectivity.)

The first column shows the number of the experiment, and the second polarity of the inversion for each slice A, B, C and D. The sign of the signal from combinations of the slices are shown in the third, fourth and fifth columns. In the sixth column the result of multiplying the individual slice signals and the combination by the polyhedron combination in column five is shown. When these results are added for the sixteen scans, all of the signals except that from AuBuCuD are zero.

By using appropriate summation schemes other selected volumes can be obtained from the same data.

Clearly, other shapes may be defined. Six slices may be used to bound a regular dodecahedron. The flexibility with which these complex polyhedral volumes may be defined enables them to be conformed closely to diverse anatomical sites without loss of signal-to-noise ratio. As the order (see below) of the polyhedra is increased the shape of the VOI can become more complex and the accuracy with which it may be contoured to anatomical regions increases.

Polyhedra consisting of pairs of parallel opposing faces may be formed efficiently by C-ISIS, each pair of faces corresponding to an inverted slice, but other forms of polyhedron are easily formed: e.g. a cube with just one corner section removed. Conceptually the polyhedral volumes bounded by 4, 5 and 6 slices may be regarded as respectively the intersection of a parallelepiped with a slice, a prism and with a second parallelepiped, and can be seen as successively truncated parallelepipeds, in the same way as a parallelepiped is a truncated prism. The minimum number of slices required to define each polyhedron can be denoted as its "Order", so for example cubes and parallelepipeds are 3rd order polyhedra, while a dodecahedron is of 6th order. The higher the order the smoother the outlines of a polyhedron may be made, and in the theoretical limit of very high order a sphere could be formed. The limit on the highest order of useable polyhedra is determined by experimental conditions as the measurements usually have to be made within a limited time and the higher the order, the more time the scan takes. The different localization options offered by the use of polyhedral VOIs are highly advantageous when high SNR spectra from various irregular shaped lesions are required.

C-ISIS can localize to any polyhedron without signal-to-noise ratio loss as will be appreciated from the following. Since a cube may be localized in an 8-scan experiment with optimum SNR, given the provisos mentioned above, it follows trivially that a 16 scan experiment consisting of these 8 scans repeated twice (2 sets of 8 named A & B respectively) also yields localization to the cube with full SNR if the signals from sets A & B are added. Now consider the modification of this experiment so that set B includes an additional inversion pulse so that only a certain sub-region of the cube undergoes inversion. Now set A still yields signal from the whole cube and so does set B, but with the signal from the sub-region inverted in sign. Subtraction of these 2 signals (A-B) now results in signal from only the sub-region of the cube that underwent all 4 inversions. This final stage is directly analogous to the 2 scan slice selective ISIS experiment described in detail above. This argument can be generalized to show that if an Nth order polyhedron can be successfully localized with C-ISIS then so can an (N+1)th order one, thus all such polyhedra are possible C-ISIS VOIs. Table 1 demonstrates that full signal to noise ratio is obtained from a 4th order polyhedron in 16 scans whilst the signal from all other regions cancels.

With the C-ISIS method a choice may be made as to whether additional slices are used for refinement of the VOI polyhedral shape, as described above, or for the simultaneous measurement of multiple spectra from different VOIs, or for both purposes. Employing a standard orthogonal ISIS sequence, 2 cuboid regions can be defined using 4 slices, 2 of them parallel, in 16 scans. In the same number of scans using a C-ISIS sequence 4 parallelepipedal VOIs can be defined at the 4 corners of a (thin walled) tetrahedron, each face of which corresponds to one of the 4 slices. If the 4 slices are allowed to overlap at the centre of the tetrahedron then a 4th order polyhedron, such as an octahedron, may also be localized.

Dependent upon the volume of interest, a suitable number of slices of appropriate width may be positioned at any orientation with respect to the rectilinear coordinate system. The approach may also be used with non-linear gradients to better specify volumes. The sequence may be used with composite RF pulses that simultaneously affect several slices and reduced sequence cycling may be achieved with partial Hadamard signal summation schemes.

Further, multiple volumes may be defined with 4 or more slices, for instance 5 slices can be used to localize to 2 VOIs of equal shape and size formed by the intersection of a hexagonal prism with 2 parallel slices. Thus the two VOI's are unconnected. This arrangement can be used to obtain a directly comparable control spectrum from contralateral normal tissue. It can also be used to look at two kidneys or the two lobes of the brain etc.

If 2 or more non-intersecting slices are always inverted together (i.e. not cycled with respect to each other) then a single spectrum localized to disconnected regions is obtained with optimum SNR as, just as described above, no summation loss is incurred.

This technique used in combination with the true multivolume method can be used to rapidly select regions of similar tissue from a volume containing heterogeneous tissue types. It can also be used to localise disconnected regions which approximate a concave-shaped region (one with an outer surface containing regions of negative surface curvature).

Figure 4:
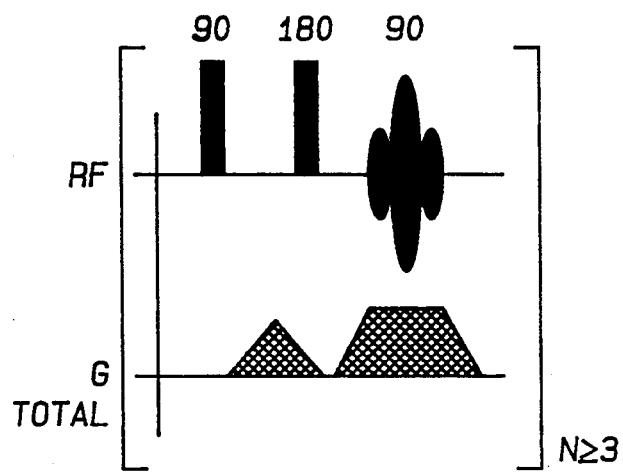
FIG. 4 shows a further pulse sequence according to the present invention.

The implementation of the first and second aspects of the invention to produce a VOI consisting of an arbitrarily oriented parallelepiped is not confined to ISIS and may be incorporated into any localization technique which in its standard form uses slice selective pulses in three orthogonal directions, such as VSE, SPARS and STEAM. The implementation of the third aspect of the invention to generate higher order polyhedra can be approached in one of two ways, only one of which involves hyperbolic-secant inversion pulses. Several localization methods (VSE/VOSY,SPARS,-SPALL) subject the spin population to repeated preparation episodes so that only those spins that experience all episodes contribute signal to the final spectrum. Conventionally only 3 such periods are used, one for each orthogonal direction, but if further episodes, see, for instance, FIG. 4 are employed, then sequences which may be denoted C-VSE, C-SPARS, C-SPALL etc. can be generated in the same way as with C-ISIS to allow the definition of high order polyhedra with these methods. FIG. 4 shows the R.F. and gradient field pulses for a C-SPARS sequence.

Figure 5:
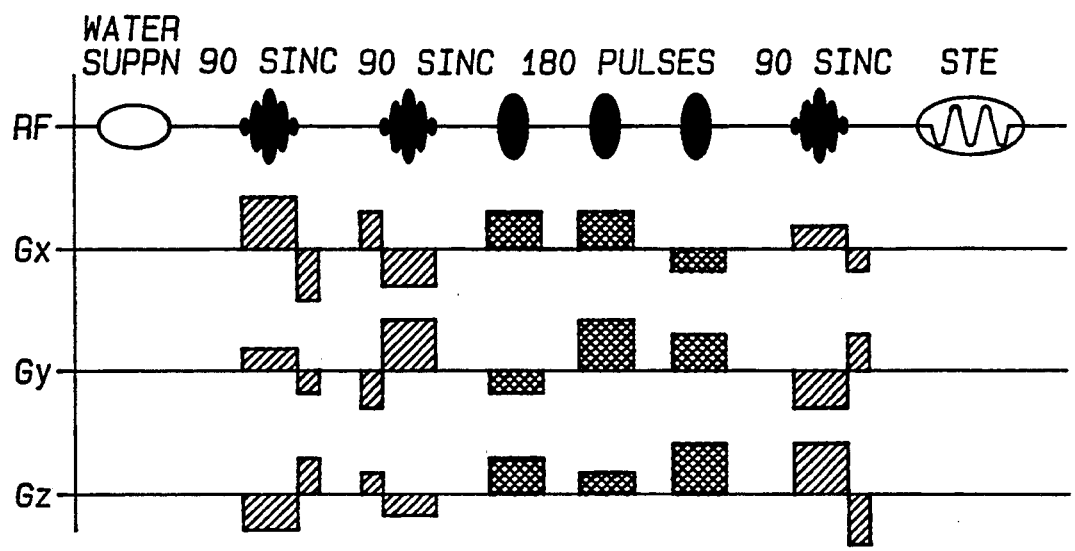
FIG. 5 shows yet a further pulse sequence according to the present invention.

The STEAM sequence is not amenable to the addition of further preparation episodes as the three selective pulses have the dual function of both defining the VOI in terms of XYZ coordinates and of generating the stimulated echo, which is by nature a 3-pulse signal, i.e. no read-out pulse has to be applied to obtain a resanance signal. However this does not preclude the use of higher order polyhedra as the STEAM sequence may be modified to incorporate a C-ISIS period using inversion pulses. This may be done either prior to the first sinc pulse or between the second and third, which may be advantageous in terms of T1 behaviour and sequence timing if other pre-pulses such as pre-saturation water suppresion are required. An example of a C-ISIS/-STEAM RF and gradient field pulse sequence is illustrated in FIG. 5. In this hybrid sequence, angled slices are used for both the ISIS inversion pulses and the stimulated echo 90 deg pulses. Since STEAM is in principle a single scan method C-ISIS/STEAM may achieve a given order of polyhedron with 8 times fewer scans than the full C-ISIS sequence. Other hybrid sequences may be considered, such as C-ISIS/SPARS which for instance has the advantage that it introduces no further T2 weighting over SPARS, unlike C-SPARS.

As discussed above, to produce an angled slice the selection gradient is produced by simultaneously energizing two or more gradient coils. The slice orientation is determined by the relative strengths of the currents in the coils energized. A beneficial consequence of this method is that the chemical shift induced slice displacement (chemical shift means that the nuclei experience a slightly different magnetic field to that applied because of the electrons around them) can be reduced, since, depending on the slice orientation, the maximum available effective gradient strength is increased by up to a maximum of the square root of 3 times the value for a single gradient coil. There is a general implementation advantage in using parallel slices where possible as this reduces the required gradient switching, and will also reduce the number of distinct RF pulses needed if more than 1 slice is inverted simultaneously.

In order to take full advantage of the localization afforded by Conformal ISIS a 3D imaging computer program is used. For some cases (e.g. examination of brain tumours) images may be available from prior MR or CT examinations and it is possible to select the slice positions based upon anatomical ROI information supplied by an operator.

Thus, by the combination of localization accurately tailored to the anatomy with a rapid and flexible multivolume capability Conformal ISIS enables in vivo 31P spectroscopy to be performed with both improved signal to noise ratios and the reliability necessary for quantitative studies.

C-ISIS allows more multivolume elements to be positioned within the sensitive region of the coil than does conventional ISIS and allows the volume element sizes to be chosen to suit the signal to noise ratio. Further, as discussed above the technique may readily be applied to extend the versatility of other NMR localization methods.

Significant aspects of the above described apparatus are that it provides a means of obtaining a spatially localised magnetic resonance signal from one or more defined regions. It also provides a means of obtaining a spatially localised magnetic resonance signal from one or more regions that are non-cuboidal or non-rectangular in shape. A further aspect is that it provides a means of obtaining a spatially localised magnetic resonance signal using a variable number of orthogonal or non-orthogonal selected planes to prepare, select, phase-encode or read out magnetisation; the signals from an appropriate scheme of acquisitions utilising such planes to be combined in a suitable manner to obtain signal localised in the said way. It also allows the addition of or combination with existing localisation methods selecting signal from cuboidal or rectilinear spaces of a set of appropriate rf pulses and gradient pulses to define and select signal from one or more non-cuboidal or rectilinear shapes and provides the means, by use of image data, to select and define such regions and to generate a sequence of instructions capable of causing signal to be acquired from the selected regions. Finally, it provides the means, by use of image data, to select and define one or more such regions of non cuboidal or non-rectilinear shape and to generate a sequence of instructions capable of causing signal to be acquired from the selected regions.

The method of "conformal" spectroscopy may also be applied to the localization of spectra from concave VOI's, rather than convex as described above, by using a pulse sequence termed the "OR Pulse".

Figure 6:
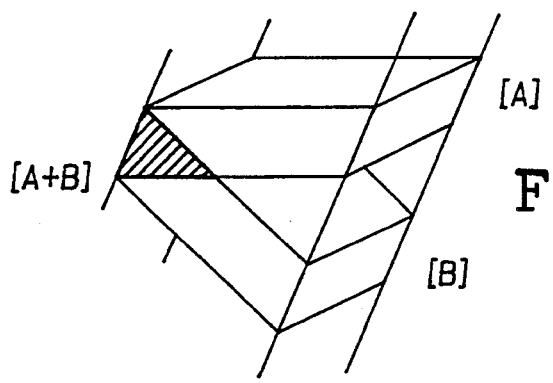
FIG. 6 shows a simple concave VOI obtainable with the present invention.
Figure 7:
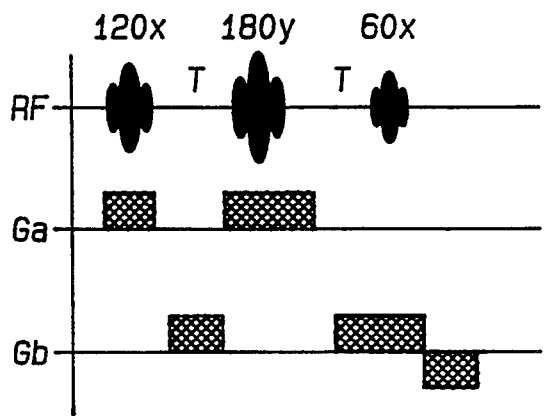
FIG. 7 shows a pulse sequence for use in obtaining a concave VOI.
Figure 8:
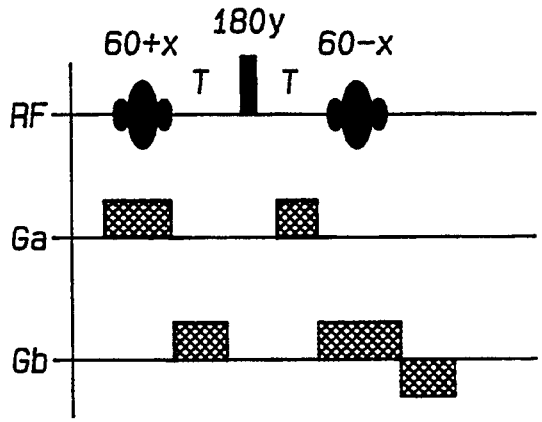
FIG. 8 shows a further pulse sequence for use in obtaining a concave VOI.

FIG. 6 shows a simple concave volume employing 4 slices, two of which define a column within which the oblique slices A and B define the concave VOI. Two pulse sequences are shown in FIGS. 7 and 8 in which Ga and Gb are the oblique selection gradients corresponding to slices A and B, and are created by energization of combinations of gradient field coils. Slice B is excited during the echo from slice A. The sequence leaves all 3 regions in either a 60° or 120° condition, and therefore, since sin 60=0.87, uniform excitation is achieved with only a small overall signal loss. There is slight $T_2$ weighting of slice A due to the echo, but where used with a STEAM sequence very little weighting occurs due to $T_1$ as the subsequent 90° pulse in the STEAM sequence tips all Mz components into the transverse plane where they are irreversibly dephased.

FIG. 7 shows a "selective 'OR Pulse'" sequence and FIG. 8 a "non-selective 'OR Pulse'" sequence.

The non-selective "OR Pulse" sequence shown in FIG. 8 consists, as can be seen, of applying a first selective electromagnetic preparation pulse having a first phase (labelled 60+x) to the sample while applying a first gradient magnetic field Ga to select a region in the form of a first slice of the sample. Then an electromagnetic pulse having a second phase (labelled 180y) is applied to the sample and subsequently a second selective electromagnetic preparation pulse having a third phase (labelled 60−x) is applied to the sample while applying a second gradient magnetic field Gb to select a region in the form of a second slice of the sample.

To obtain the signed contribution from all three regions as mentioned above, the phases and the amplitudes of the selective electromagnetic pulses are chosen such that the resonance signal from the sample has substantially the same intensity and phase from within the first and second slices and from the region of the sample defined by the overlap of the first and second slices.

The selective OR pulse sequence, which is used in similar fashion, is illustrated in FIG. 7 and it can be seen that the sequence consists of applying a first selective electromagnetic preparation pulse having a first phase (labelled 120x) to the sample while applying a first gradient magnetic field Ga to select a region in the form of a first slice of the sample. Then a second selective electromagnetic preparation pulse having a second phase (labelled 180y) is applied while applying a second gradient magnetic field Ga to further condition the magnetization in the first slice. Then a third electromagnetic preparation pulse having a third phase (labelled 60 x) is applied while applying a third gradient magnetic field to select a region in the form of a second slice of the sample. Of the two versions described above, the non-selective implementation is preferably in terms of RF requirements, a shorter echo-time and uniformity of excitation (due to the avoidance of saturation bands adjacent to slice A which occur with selective refocusing). However, selective refocusing, preferably using an optimised pulse waveform, can give acceptable results in applications where it is undesirable to disturb the entire sample magnetization.

The OR pulse can be used as a building block with multi-frequency pulses (5) to define complex VOI's such as toroids. Single-shot shimming with STEAM may be performed using the OR-pulse, which is an important feature for practical $^1H$ spectroscopy.

We claim:

1. A method of spatially localized magnetic resonance spectroscopy for detecting localized signal from a region of interest in a sample, the method including applying a continuous magnetic field defining a $B_o$ axis and including the following sequence of steps:

simultaneously energizing a plurality of gradient magnetic field coils, each of which individually can create a gradient magnetic field in a respective direction in the sample, with simultaneous pulses which comprise concurrent periods of respective first steady levels to create a first resultant gradient magnetic field in a direction different to that of those provided by the coils if energized separately, and applying an electromagnetic inversion pulse during the said concurrent periods to reverse the direction of magnetization along the $B_o$ axis in a first slice of the sample intersecting the region of interest;

subsequently removing said resultant gradient magnetic field and then energizing at least one of the gradient field coils by a pulse having a second steady level to create a second resultant gradient magnetic field, and simultaneously applying a further electromagnetic inversion pulse to reverse the direction of magnetization in a second slice which is non-orthogonal to the first slice and intersects it in the region of interest in the sample;

subsequently removing said second resultant gradient magnetic field and then energizing at least one of the gradient field coils by a pulse having a third steady level to create a third resultant gradient magnetic field, and simultaneously applying a further electromagnetic inversion pulse to reverse the direction of magnetization in a third slice intersecting the first and second slices in the region of interest in the sample; and subsequently reading out in the absence of a gradient magnetic field a resonance signal from the entire sample;

performing one or more further sequences of steps of applying in turn respective gradient magnetic fields simultaneously with respective electromagnetic inversion pulses to reverse the magnetization in respective slices intersecting in the region of interest followed by reading out in the absence of gradient magnetic fields respective further resonance signals each from the entire sample; and combining the respective read-out signals to derive a resultant signal relating to the localized region of interest of the sample defined by the intersection of the slices.

2. A method according to claim 1, wherein three orthogonal gradient field coils are used.

3. A method according to claim 1 wherein the resonance signal is detected by application of a read-out pulse sequence.

4. A method according to claim 1 further comprising the step of applying further pulses to condition the resonance signal.

5. A method according to claim 1 including the steps of applying a first selective electromagnetic preparation pulse having a first phase to the sample while applying a first gradient magnetic field to select a region in the form of a first slice of the sample, then applying an electromagnetic pulse having a second phase to the sample, applying a second selective electromagnetic preparation pulse having a third phase to the sample while applying a second gradient magnetic field to the sample to select a region in the form of a second slice of the sample, wherein the first, second and third phases and the amplitudes of all the selective electromagnetic pulses are such that the resonance signal from the sample has substantially the same intensity and phase from within the first and second slices and from the region of the sample defined by the overlap of the first and second slices.

6. A method according to claim 1 including the steps of applying a first selective electromagnetic preparation pulse having a first phase to the sample while applying a first gradient magnetic field to select a region in the form of a first slice of the sample, then applying a second selective electromagnetic preparation pulse having a second phase while applying a second gradient magnetic field to further condition the magnetization in the first slice, then applying a third selective electromagnetic preparation pulse having a third phase while applying a third gradient magnitude field to the sample to select a region in the form of a second slice of the sample.

7. A method according to claim 1 including the step of defining more than three intersecting slices through the sample to create a polyhedral sampled region.

8. A method according to claim 1 including the step of defining three or more slices through the sample to define unconnected sampled regions in the sample.

9. A method according to claim 1 including the steps of energizing a first combination of the gradient magnetic field coils and applying a first electro-magnetic preparation pulse to the sample, successively energizing at least one of the gradient field coils by a different magnitude at least three further times each with application of a respective electro-magnetic preparation pulse, subsequently applying a read-out signal from the sample, and repeating the above steps with different energizations of the gradient field coils and combining the results to derive a signal from a localized region of the sample.

10. A method of nuclear magnetic resonance spectroscopy comprising a method according to claim 1 including the step of applying a at least one of suppression, preparation and editing pulse train to a sample.

11. A method according to claim 1 wherein two excitation pulses are applied immediately after a suppression signal and one excitation pulse immediately before a read-out sequence.

12. A method according to claim 1 wherein the gradient magnetic fields are applied in pulses and are non-time-varying during the pulse.

13. A method according to claim 1 wherein the gradient magnetic fields are spatially non-linear through at least part of the sample.

14. A method according to claim 1 wherein the gradient magnetic fields are spatially linear through at least part of the sample.

15. A method according to claim 1 wherein the step of reading out signal from the entire sample includes the application of a non-selective readout pulse.

16. A method according to claim 15 wherein the second and third steady levels are respectively different to the first steady level.

* * * * *